(12) United States Patent
Chen et al.

(10) Patent No.: US 10,658,369 B2
(45) Date of Patent: May 19, 2020

(54) SEMICONDUCTOR DEVICE AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Kun-Hsin Chen, Pingtung County (TW); Hsuan-Tung Chu, Tainan (TW); Tsuo-Wen Lu, Kaohsiung (TW); Po-Chun Chen, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/027,356

(22) Filed: Jul. 4, 2018

(65) Prior Publication Data
US 2019/0378844 A1    Dec. 12, 2019

(30) Foreign Application Priority Data
Jun. 8, 2018   (CN) .......................... 2018 1 0586454

(51) Int. Cl.
*H01L 27/108*   (2006.01)
*H01L 21/762*   (2006.01)
*H01L 21/02*    (2006.01)
*H01L 29/06*    (2006.01)

(52) U.S. Cl.
CPC .... *H01L 27/10894* (2013.01); *H01L 21/0217* (2013.01); *H01L 21/0228* (2013.01); *H01L 21/02164* (2013.01); *H01L 21/76229* (2013.01); *H01L 27/10897* (2013.01); *H01L 29/0649* (2013.01)

(58) Field of Classification Search
None
See application file for complete search history.

(56) References Cited

U.S. PATENT DOCUMENTS

| | | | |
|---|---|---|---|
| 10,164,008 B1* | 12/2018 | Nagai | H01L 21/76229 |
| 2005/0167778 A1* | 8/2005 | Kim | H01L 21/76224 257/510 |
| 2007/0205489 A1* | 9/2007 | Tilke | H01L 21/76229 257/618 |
| 2008/0157264 A1* | 7/2008 | Zhao | H01L 21/76224 257/510 |
| 2009/0256233 A1* | 10/2009 | Eun | H01L 21/76229 257/510 |
| 2015/0270337 A1* | 9/2015 | Ujihara | H01L 27/10894 257/510 |

* cited by examiner

*Primary Examiner* — Mounir S Amer
(74) *Attorney, Agent, or Firm* — Winston Hsu

(57) ABSTRACT

A method for fabricating semiconductor device includes the steps of: providing a substrate having a memory region and a periphery region; forming a first trench and a second trench in substrate on the memory region, wherein a width of the second trench is greater than a width of the first trench; forming a first liner in the first trench and the second trench; forming a second liner on the first liner, wherein the second liner completely fills the first trench and partly fills the second trench; and planarizing the second liner and the first liner to form a first isolation structure and a second isolation structure.

9 Claims, 3 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for fabricating a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of: providing a substrate having a memory region and a periphery region; forming a first trench and a second trench in substrate on the memory region, wherein a width of the second trench is greater than a width of the first trench; forming a first liner in the first trench and the second trench; forming a second liner on the first liner, wherein the second liner completely fills the first trench and partly fills the second trench; and planarizing the second liner and the first liner to form a first isolation structure and a second isolation structure.

According to another aspect of the present invention, a semiconductor device includes a substrate having a memory region and a periphery region, a first isolation structure in the substrate on the memory region, a second isolation structure adjacent to the first isolation structure, in which a width of the second isolation structure is greater than a width of the first isolation structure. Preferably, the first isolation includes a first liner in the substrate and a second liner on the first liner, and the second isolation structure includes the first liner in the substrate, the second liner on the first liner, and a third liner on the second liner.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
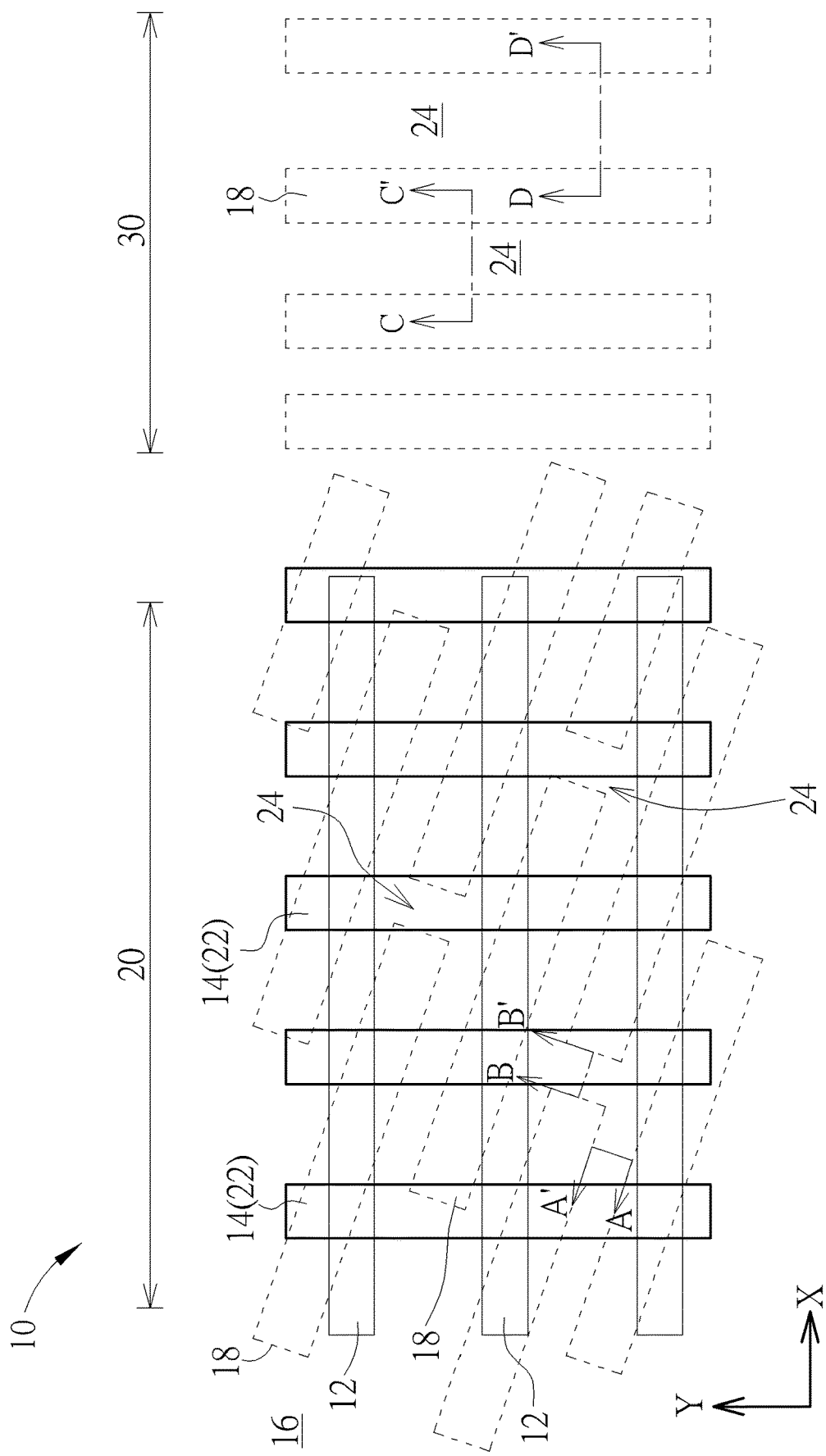
FIG. 1 illustrates a top-view of a DRAM device according to an embodiment of the present invention.
Figure 2:
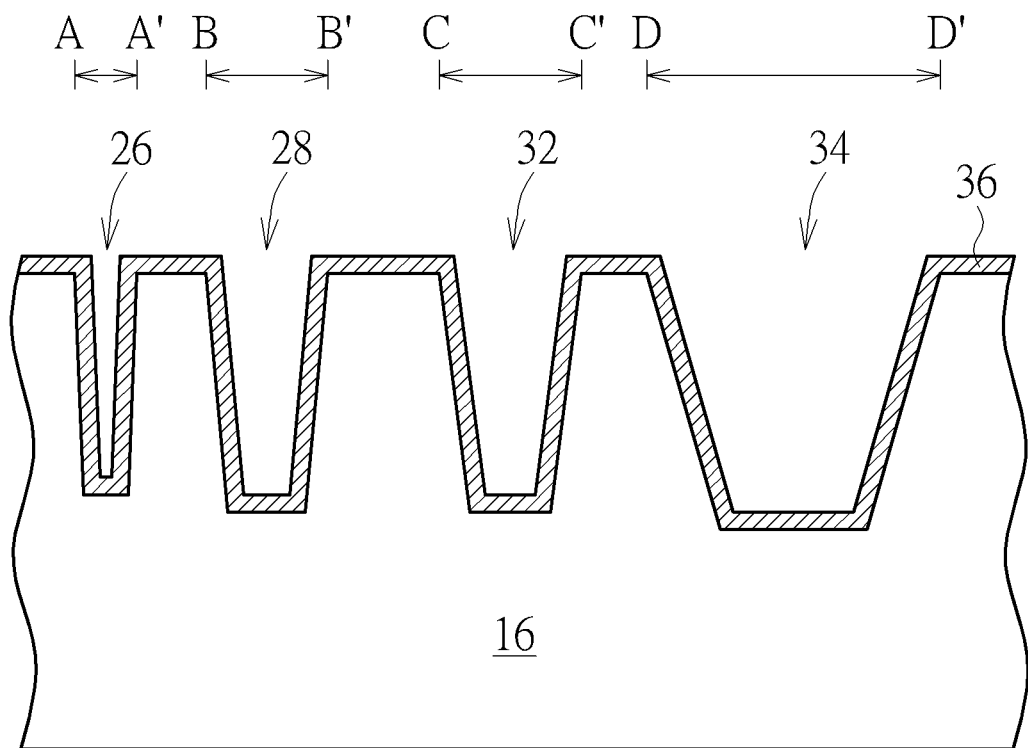
FIGS. 2-4 illustrate cross-sectional views for fabricating the DRAM device along the sectional line AA', the sectional line BB', the sectional line CC', and the sectional line DD' of FIG. 1.
Figure 3:
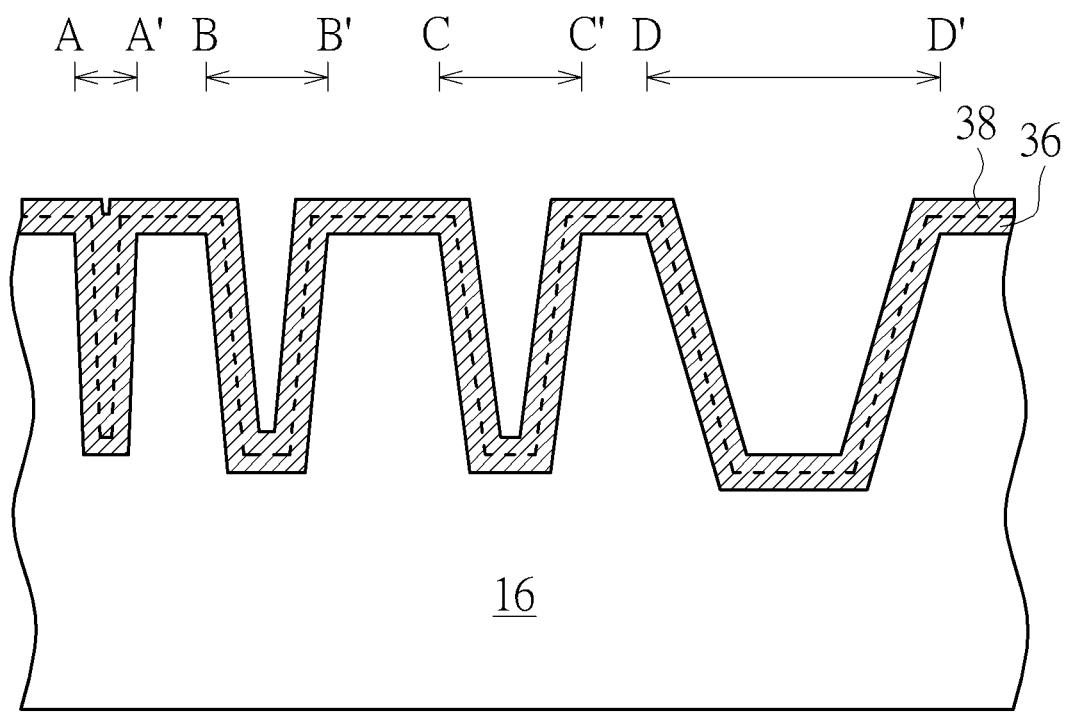
Figure 4:
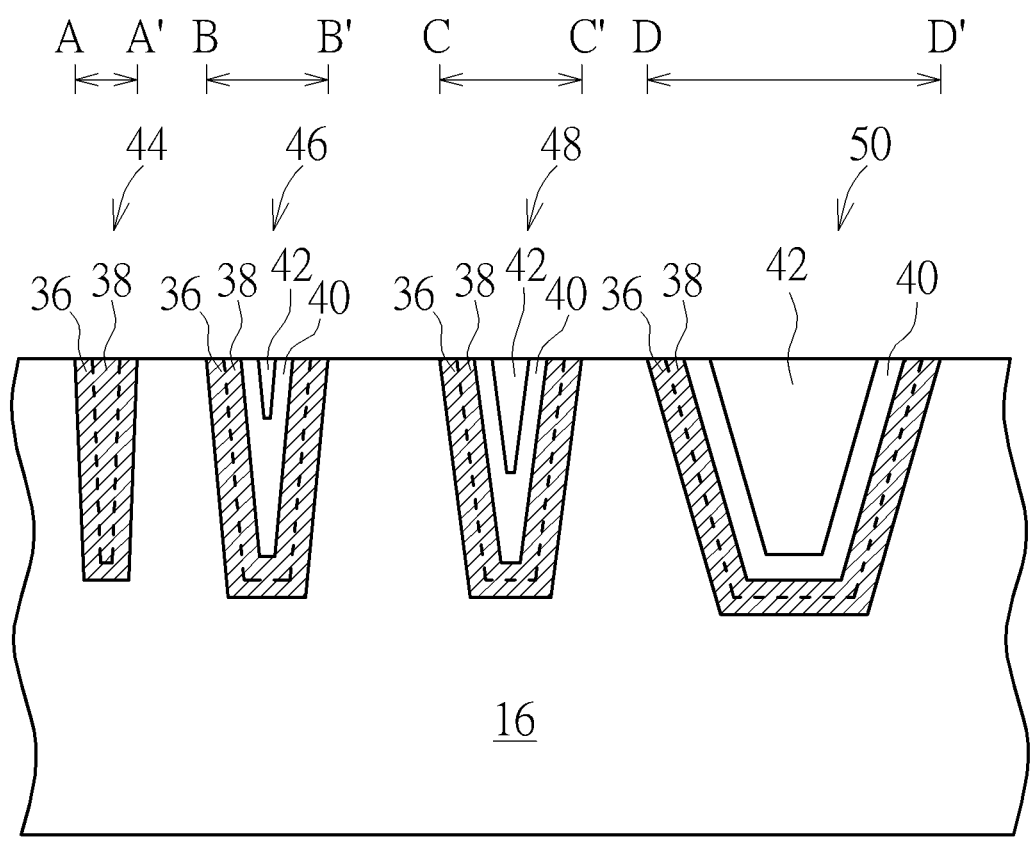

Referring to FIGS. 1-4, FIGS. 1-4 illustrate a method for fabricating a DRAM device according to an embodiment of the present invention, in which FIG. 1 illustrates a top-view of a DRAM device according to an embodiment of the present invention and FIGS. 2-4 illustrate cross-sectional views for fabricating the DRAM device along the sectional line AA', the sectional line BB', the sectional line CC', and the sectional line DD' of FIG. 1. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines 12 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region 30 are also defined on the substrate 16, in which multiple word lines 14 and multiple bit lines 12 are preferably formed on the memory region 20 while other active devices (not shown) could be formed on the periphery region 30.

In this embodiment, the active regions 18 are disposed parallel to each other and extending along a first direction, the word lines 14 or multiple gates 22 are disposed within the substrate 16 and passing through the active regions 18 and STI 24. Preferably, the gates 22 are disposed extending along a second direction, in which the second direction crosses the first direction at an angle less than 90 degrees.

The bit lines 12 on the other hand are disposed on the substrate 16 parallel to each other and extending along a third direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

The fabrication of STI or isolation structures before the formation of word lines 14 (or also referred to as buried word lines) is explained below. As shown in FIG. 2, a first trench 26 and a second trench 28 are formed in the substrate 16 on the memory region 20 and a third trench 32 and a fourth trench 34 are formed in the substrate 16 on the periphery region 30, in which the first trench 26 is a cross-section view of the memory region 20 taken along the sectional line AA' shown in FIG. 1 or more specifically the distance between longer axes of two adjacent active regions 18, the second trench 28 is a cross-section view of the memory region 20 taken along the sectional line BB' shown in FIG. 1 or more specifically the distance between ends of two adjacent active regions 18, the third trench 32 is a cross-section view of the periphery region 30 taken along the sectional line CC' shown in FIG. 1, and the fourth trench 34 is a cross-section view of the periphery region 30 taken along the sectional line DD' shown in FIG. 1. Each of the third trench 32 and the fourth trench 34 preferably measures a distance between two adjacent active regions 18 in the periphery region 30.

In this embodiment, the first trench 26 being measured the distance between longer axes of two adjacent active regions 18 is also referred to as the body to body (B2B) trench, and the second trench 28 being measured the distance between two ends or tips of two adjacent active regions 18 is also referred to as the tip to tip (T2T) trench. Preferably, the width of the second trench 28 is greater than the width of the first trench 26, the width of the third trench 32 is greater than the width of the second trench 28, and the width of the fourth trench 34 is greater than the width of the third trench 32. Next, an atomic layer deposition (ALD) process is conducted to form a first liner 36 on the surface of the substrate 16 and into the first trench 26, the second trench 28, the third trench 32, and the fourth trench 34 without filling each of the trenches 26, 28, 32, 34.

Next, as shown in FIG. 3, an in-situ steam generation (ISSG) process is conducted to form a second liner 38 on the first liner 36. It should be noted that the ISSG process is conducted to form the second liner 38 into the four trenches 26, 28, 32, 34, in which the second liner 38 completely fills the first trench 26 but only fills part of the second trench 28, part of the third trench 32, and part of the fourth trench 34. The definition of completely filling the trench at this stage refers to that the second liner 38 not only fills all of the first trench 26 but the top surface of the second liner 38 is also higher than the top surface of the substrate 16 adjacent to two sides of the first trench 26.

In this embodiment, the maximum width of the first trench 26 is between 180-220 Angstroms or most preferably around 200 Angstroms, the maximum width of the second trench 28 is between 360-440 Angstroms or most preferably around 400 Angstroms, the maximum width of the third trench 32 is between 900-1100 Angstroms or most preferably around 1000 Angstroms, and the maximum width of the fourth trench 34 is between 0.9-1.1 microns or most preferably around 1.0 micron.

It should be noted that after using the aforementioned ALD process to form the first liner 36, the width of the remaining first trench 26 is preferably controlled at less than 60 Angstroms so that the second liner 38 formed through the ISSG process afterwards could fill the first trench 26 completely. In this embodiment, the first liner 36 and the second liner 38 are preferably made of same material such as silicon oxide.

Next, as shown in FIG. 4, an ALD process is conducted to form a third liner 40 on the second liner 38 and another ALD process is conducted to form a fourth liner 42 on the third liner 40 to fill the second trench 28, the third trench 32, and the fourth trench 34 completely. Next, a planarizing process such as chemical mechanical polishing (CMP) process and/or etching process is conducted to remove part of the fourth liner 42, part of the third liner 40, part of the second liner 38, and part of the first liner 36 to form a first isolation structure 44 and a second isolation structure 46 on the memory region 20 and a third isolation structure 48 and a fourth isolation structure 50 on the periphery region 30.

Preferably, the first isolation structure 44, the second isolation structure 46, the third isolation structure 48, and the fourth isolation structure 50 are also represented by the STI 24 shown in FIG. 1, and the top surface of each of the isolation structures could be even with the top surface of the substrate 16 or slightly lower than the top surface of the substrate 16, which are all within the scope of the present invention. In this embodiment, the third liner 40 and the fourth liner 42 are preferably made of different materials, in which the third liner 40 preferably includes silicon nitride and the fourth liner 42 includes silicon oxide, but not limited thereto. Next, it would be desirable to form buried word lines on the memory region 20 and form gate structures on the periphery region 30 depending on the demand of the process. This completes the fabrication of a semiconductor device according to an embodiment of the present invention.

Referring again to FIG. 4, FIG. 4 further illustrates a structural view of a semiconductor device according to an embodiment of the present invention. As shown in FIG. 4, the semiconductor device preferably includes a first isolation structure 44 and a second isolation structure 46 disposed in the substrate 16 on the memory region 20 and a third isolation structure 48 and a fourth isolation structure 50 disposed in the substrate 16 on the periphery region 30. In this embodiment, the width of the second isolation structure 46 or more specifically the width of the topmost surface of the second isolation structure 46 is greater than the width of the first isolation structure 44 or more specifically the width of the topmost surface of the first isolation structure 44. Moreover, the width (or most specifically the width of the topmost surface) of the third isolation structure 48 is greater than the width (or more specifically the width of the topmost surface) of the second isolation structure 46, and the width (or more specifically the width of the topmost surface) of the fourth isolation structure 50 is greater than the width (or more specifically the width of the topmost surface) of the third isolation structure 48.

Viewing from a more detailed perspective, the first isolation structure 44 includes a first liner 36 disposed in the substrate 16 and a second liner 38 disposed on the first liner 36, in which the top surface of the first liner 36 and the second liner 38 is even with or slightly lower than the top surface of the substrate 16. In contrast to the first isolation structure 44 only includes two liners, each of the second isolation structure 46, the third isolation structure 48, and the fourth isolation structure 50 includes four liners, including a first liner 36 in the substrate 16, a second liner 38 disposed on the first liner 36, a third liner 40 disposed on the second liner 38, and a further liner 42 disposed on the third liner 40.

In this embodiment, the first liner 36 in the first isolation structure 44 and the first liner 36, the second liner 38, and the third liner 40 in each of the second isolation structure 46, the third isolation structure 48, and the fourth isolation structure 50 is U-shaped or V-shaped (such as the third liner 40 in the second isolation structure 46 and the third isolation structure 48). Moreover, the first liner 36 and the second liner 38 are preferably made of same material such as silicon oxide, the second liner 38 and the third liner 40 are preferably made of different materials and the third liner 40 and the fourth liner 42 are also made of different materials. For instance, the third liner 40 in this embodiment preferably includes silicon nitride and the fourth liner 42 preferably includes silicon oxide.

In current DRAM process, four trenches having different widths as disclosed in the aforementioned embodiment are first formed in the substrate on the memory region and the periphery region respectively, and an ISSG process and an ALD process are conducted in sequence to form a first liner and a second liner both made of silicon oxide in the four trenches. Nevertheless, it has been observed that the order of first conducting the ISSG process and then conducting the ALD process is unable to fill the first trench (or the B2B trench from the aforementioned embodiment) completely with the first liner and the second liner made of silicon oxide so that the third liner made of silicon nitride would be filled into the first trench and the remaining three trenches and resulting in voids.

To resolve this issue, the present invention preferably reverse the process for forming the first liner and the second liner by first performing an ALD process to form a first liner in the four trenches and then conducting an ISSG process to form a second liner again in the four trenches while filling the B2B trench completely but not filling the other three trenches having greater widths. Since the B2B trench has already been filled by the first liner and the second liner, the third liner made of silicon nitride and the fourth liner made of silicon oxide would only be filled into the remaining three trenches except the first trench (or the B2B trench). By using this approach the present invention is able to effectively reduce the formation of voids during fabrication of the isolation structures for DRAM device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a memory region and a periphery region;
   a first isolation structure in the substrate on the memory region, wherein the first isolation comprises:
   a first liner in the substrate; and
   a second liner on the first liner;
   a second isolation structure adjacent to the first isolation structure, wherein a width of the second isolation structure is greater than a width of the first isolation structure, the second isolation structure comprises:
   the first liner in the substrate;
   the second liner on the first liner; and
   a third liner on the second liner of the second isolation structure and not on the second liner of the first isolation structure.

2. The semiconductor device of claim 1, further comprising a third isolation structure and a fourth isolation structure in the substrate on the periphery region, wherein a width of the third isolation structure is greater than a width of the second isolation structure and a width of the fourth isolation structure is greater than a width of the third isolation structure.

3. The semiconductor device of claim 2, wherein each of the third isolation structure and the fourth isolation structure comprises:
   the first liner in the substrate;
   the second liner on the first liner; and
   the third liner on the second liner.

4. The semiconductor device of claim 3, further comprising a fourth liner on the third liner.

5. The semiconductor device of claim 4, wherein the third liner and the fourth liner comprise different materials.

6. The semiconductor device of claim 4, wherein the third liner comprises silicon nitride and the fourth liner comprises silicon oxide.

7. The semiconductor device of claim 1, wherein the first liner and the second liner comprise same material.

8. The semiconductor device of claim 7, wherein the first liner and the second liner comprise silicon oxide.

9. The semiconductor device of claim 1, wherein each of the first liner, the second liner, and the third liner is U-shaped.

* * * * *